United States Patent
Himbele et al.

(10) Patent No.: US 11,355,319 B2
(45) Date of Patent: Jun. 7, 2022

(54) PLASMA PROCESSING APPARATUS

(71) Applicant: HITACHI HIGH-TECH CORPORATION, Tokyo (JP)

(72) Inventors: Luke Joseph Himbele, Tokyo (JP); Yasushi Sonoda, Tokyo (JP); Takashi Uemura, Tokyo (JP); Tomoyoshi Ichimaru, Tokyo (JP); Junya Sasaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 262 days.

(21) Appl. No.: 16/216,455

(22) Filed: Dec. 11, 2018

(65) Prior Publication Data

US 2019/0189403 A1 Jun. 20, 2019

(30) Foreign Application Priority Data

Dec. 19, 2017 (JP) .............................. JP2017-242308

(51) Int. Cl.
*H01J 37/32* (2006.01)
*H01L 21/3065* (2006.01)
(Continued)

(52) U.S. Cl.
CPC .. *H01J 37/32449* (2013.01); *C23C 16/45536* (2013.01); *F16K 31/0603* (2013.01);
(Continued)

(58) Field of Classification Search
CPC ........ C23C 16/45536; C23C 16/45561; C23C 16/511; F16K 31/0603; F16K 31/0675;
(Continued)

(56) References Cited

U.S. PATENT DOCUMENTS 2,981,287 A 4/1961 Caslow
3,452,781 A 7/1969 Napolitano
(Continued)

FOREIGN PATENT DOCUMENTS

JP S6214429 A 1/1987
JP H2230729 A 9/1990
(Continued)

OTHER PUBLICATIONS

Office Action dated Dec. 9, 2019 in corresponding Korean Application No. 10-2018-0157894.
(Continued)

*Primary Examiner* — Benjamin Kendall
(74) *Attorney, Agent, or Firm* — Miles & Stockbridge, P.C.

(57) ABSTRACT

The present invention is a plasma processing apparatus that includes a processing chamber where plasma processing is performed on a sample, a radio frequency power supply that supplies radio frequency power to generate plasma, a sample stage on which the sample is placed, and a gas supply unit that supplies a gas to the processing chamber. The gas supply unit includes a first pipe that supplies a first gas as a gas for etching process to the processing chamber, a second pipe that supplies a second gas as a gas for etching process to the processing chamber, and a third pipe through which a third gas as a gas for deposition process flows. The third pipe is coupled to the second pipe. A fourth valve is arranged on the second pipe. The fourth valve prevents the third gas from flowing in a direction toward a supply source of the second gas.

9 Claims, 8 Drawing Sheets

(51) Int. Cl.
*F16K 31/12* (2006.01)
*F16K 31/06* (2006.01)
*F16K 51/02* (2006.01)
*C23C 16/455* (2006.01)

(52) U.S. Cl.
CPC .............. *F16K 31/12* (2013.01); *F16K 51/02* (2013.01); *H01J 37/32192* (2013.01); *H01L 21/3065* (2013.01); *F16K 31/0675* (2013.01)

(58) Field of Classification Search
CPC .... F16K 31/12; F16K 51/02; H01J 37/32192; H01J 37/3244–32449; H01L 21/3065
See application file for complete search history.

(56) References Cited

U.S. PATENT DOCUMENTS

| | | | |
|---|---|---|---|
| 3,760,843 | A | 9/1973 | Lamer |
| 4,450,031 | A | 5/1984 | Ono et al. |
| 4,638,837 | A | 1/1987 | Buike et al. |
| 4,669,404 | A | 6/1987 | Yoneda |
| 4,844,767 | A | 7/1989 | Okudaira et al. |
| 4,960,073 | A | 10/1990 | Suzuki et al. |
| 5,178,962 | A | 1/1993 | Miyamoto et al. |
| 5,284,544 | A | 2/1994 | Mizutani et al. |
| 5,992,460 | A | 11/1999 | Akimoto |
| 5,998,986 | A | 12/1999 | Ido |
| 6,082,406 | A | 7/2000 | Williamson, Jr. et al. |
| 6,145,541 | A | 11/2000 | Hirota |
| 6,162,323 | A * | 12/2000 | Koshimizu ......... H01J 37/3244 156/345.26 |
| 6,192,937 | B1 | 2/2001 | Fagerlie et al. |
| 6,287,980 | B1 | 9/2001 | Hanazaki et al. |
| 10,121,686 | B2 | 11/2018 | Ogawa et al. |
| 2002/0106845 | A1 | 8/2002 | Chao et al. |
| 2003/0212507 | A1 | 11/2003 | Wei et al. |
| 2004/0129671 | A1 | 7/2004 | Ji et al. |
| 2007/0163477 | A1 | 7/2007 | Nagata et al. |
| 2008/0110400 | A1 | 5/2008 | Satou et al. |
| 2009/0029564 | A1 | 1/2009 | Yamashita et al. |
| 2011/0120649 | A1 | 5/2011 | Satou et al. |
| 2012/0064726 | A1 | 3/2012 | Nozawa et al. |
| 2012/0222751 | A1 * | 9/2012 | Okabe ............... H01L 21/67017 137/14 |
| 2012/0231553 | A1 | 9/2012 | Okita et al. |
| 2012/0255617 | A1 | 10/2012 | Miyazoe et al. |
| 2013/0270625 | A1 | 10/2013 | Jang et al. |
| 2013/0319615 | A1 | 12/2013 | Cho et al. |
| 2014/0057447 | A1 | 2/2014 | Yang et al. |
| 2015/0083582 | A1 | 3/2015 | Dhindsa et al. |
| 2015/0330519 | A1 | 11/2015 | Maurer et al. |
| 2016/0133530 | A1 * | 5/2016 | Sonoda ................ H01L 21/308 438/10 |
| 2016/0177443 | A1 | 6/2016 | Kumar et al. |
| 2016/0379857 | A1 * | 12/2016 | Ogawa ................... F16K 51/02 137/587 |
| 2018/0047595 | A1 | 2/2018 | Kofuji et al. |

FOREIGN PATENT DOCUMENTS

| | | |
|---|---|---|
| JP | H03-218018 A | 9/1991 |
| JP | H04180621 A | 6/1992 |
| JP | H04-225226 A | 8/1992 |
| JP | 05-07763 A | 1/1993 |
| JP | H05234947 A | 9/1993 |
| JP | H08107101 A | 4/1996 |
| JP | 2000-306884 A | 11/2000 |
| JP | 2001-85342 A | 3/2001 |
| JP | 2001-319882 A | 11/2001 |
| JP | 2003229419 A | 8/2003 |
| JP | 2008124190 A | 5/2008 |
| JP | 2009094401 A | 4/2009 |
| JP | 2013214583 A | 10/2013 |
| JP | 2013251546 A | 12/2013 |
| JP | 201550362 A | 3/2015 |
| JP | 2015-065434 A | 4/2015 |
| JP | 2015092637 A | 5/2015 |
| JP | 2016145412 A | 8/2016 |
| KR | 20050099723 A | 10/2005 |
| KR | 20080086172 A | 9/2008 |
| KR | 20170101952 A | 9/2017 |
| KR | 20170108916 A | 9/2017 |
| TW | 544805 B | 8/2003 |
| TW | 201234474 A | 8/2012 |
| TW | 201417172 A | 5/2014 |
| WO | 2005024926 A1 | 3/2005 |
| WO | 2005104203 A1 | 11/2005 |
| WO | 2016121075 A1 | 8/2016 |
| WO | WO-2016121075 A1 * | 8/2016 ......... H01L 21/3065 |

OTHER PUBLICATIONS

Office Action dated Sep. 28, 2018 in corresponding Taiwanese Application 106123071.
Office Action dated Nov. 26, 2018 in corresponding U.S. Appl. No. 15/558,005.
Office Action dated Feb. 7, 2020 in corresponding U.S. Appl. No. 15/558,005.
Office Action dated Jun. 14, 2019 in corresponding U.S. Appl. No. 15/558,005.
Office Action dated Mar. 5, 2019 in Japanese Application 2018-037128.
Office Action dated Jul. 21, 2020 in corresponding Japanese Application No. 2019-124995.
Office Action dated Apr. 2, 2021 in U.S. Appl. No. 15/558,005.

* cited by examiner

ADSORPTION SPECIES

PURGE

PURGE

REACTION

ADSORPTION SPECIES

PURGE

REACTION

PURGE

ADSORPTION
SPECIES

PURGE

REACTION

PURGE

PLASMA PROCESSING APPARATUS

CROSS-REFERENCE TO RELATED APPLICATIONS

The present application claims priority to Japanese Patent Application No. 2017-242308, filed Dec. 19, 2017. The contents of this application are incorporated herein by reference in their entirety.

BACKGROUND

The present invention relates to a plasma processing apparatus using plasma related to a semiconductor production.

Recently, high integration of devices has advanced, and a processing technique at an atomic layer level has been required. Complication of a device structure, miniaturization of the device structure, and increase in aspect ratio of the device structure have advanced every year. Thus, CD dimension control and depth control for a sparse part and a dense part of a high-aspect structure have become key techniques.

Conventionally, in order to control a sparse/dense difference, plasma has been generated inside an etching chamber to perform etching and adjustment of a deposited film. However, a problem that a covering property (Step Coverage) in a high-aspect pattern becomes worse has become apparent. For this problem, use of an Atomic Layer Deposition (ALD, hereinafter referred to as the ALD) that ensures film formation having a good covering property has been examined.

Although a precursor gas as a raw material differs depending on a membrane material as an object, a precursor gas in an atomic unit is periodically supplied to a film forming substrate surface together with a carrier gas to be physically adsorbed on the substrate surface, thus ensuring film formation of a film having one layer of atoms. The use of the ALD has been known as one of effective means that ensures uniform and highly accurate film thickness control even in the high-aspect structure.

As the precursor gas used in the ALD, for example, BDEAS is used. Since the BDEAS has a property close to that of ammonia, it is necessary to avoid being mixed with a supporting gas. In view of this, in a vacuum processing apparatus including an ALD mechanism that ensures uniform film formation, there is a need to include gas supply means having a hard interlock of a gas valve in accord with the safety.

For example, Japanese Unexamined Patent Application Publication No. 2016-145412 as a prior art regarding the atomic layer deposition (ALD) discloses a method for uniformly dosing a precursor for improving film uniformity in a vapor deposition cycle of an atomic layer depositing method (ALD). Regarding the interlock of the gas valve, WO2016/121075 discloses a vacuum processing apparatus that has gas supply means having a hard interlock for a pair of gas valves. Furthermore, Japanese Unexamined Patent Application Publication No. 2008-124190 discloses a vacuum processing apparatus capable of uniformly processing a specimen placed on a sample stand in a processing chamber.

In order to perform an atomic layer deposition (ALD) process, a configuration and a hard interlock of a gas supply system are required to safely supply a precursor gas having high reactivity and high inflammability into a vacuum container.

The atomic layer deposition (ALD) process supplies the precursor gas (adsorption species) into a vacuum processing apparatus to form a molecular layer with physical adsorption on a sample substrate and inside the vacuum processing apparatus. This molecular layer has one layer having strongest physical adsorption force (van der Waals force) that remains even when an exhaust process using an inert gas or the like is performed. In view of this, there is concern that the molecular layer adsorbed inside a vacuum processing chamber reacts at the time of processing after the atomic layer deposition (ALD) process to generate a particle.

FIG. 6 illustrates a method of supplying the precursor gas to a plasma processing apparatus. In this method of supplying the precursor gas to the plasma processing apparatus, the precursor gas is supplied into a processing chamber through a plate having a through-hole such as a shower plate. However, the passage through the through-hole of the shower plate causes concern about the generation of the particle in the through hole. There is concern that this particle drops on the sample substrate, which is an extension of the through-hole of the shower plate to generate a defect, and thus, a stable production by reducing a yield in an etching process of the sample substrate cannot be performed.

There is concern in the safety that, for example, the precursor gas mixes with a process gas inside a gas supply pipe to cause a product to be fixedly secured inside the gas pipe, and thus, the gas supply pipe gets stuck. Usually, an interlock function with software is implemented to avoid dangerous manipulation that is input incorrectly or purposely. However, in many cases, the soft interlock is considered insufficient as a foolproof function. Thus, in addition to an electrical interlock (soft interlock), yet another mechanism is required.

In view of this, it is necessary to implement a function that prevents the mixture by using a double hard interlock with respect to valves for a pair of gases that must not be simultaneously flowed. Accordingly, in opening/closing operation of the respective gas valves, it is required that, in accordance with a pressure signal or a preliminarily examined circuit using an electrical relay circuit or the like, the mutual opening/closing operations between different valves are controlled to prevent generation of abnormal reaction, leakage, contamination of a gas source (mixture with another gas), and the like of the gas.

In consideration of the above-described problems, the present invention provides a plasma processing apparatus that ensures a stable supply of a process gas and a precursor gas to a processing chamber.

SUMMARY

The present invention is a plasma processing apparatus that includes a processing chamber where plasma processing is performed on a sample, a radio frequency power supply that supplies radio frequency power to generate plasma, a sample stage on which the sample is placed, and a gas supply unit that supplies a gas to the processing chamber. The gas supply unit includes a first pipe that supplies a first gas as a gas for etching process to the processing chamber, a second pipe that supplies a second gas as a gas for etching process to the processing chamber, and a third pipe through which a third gas as a gas for deposition process flows. The third pipe is coupled to the second pipe. A fourth valve is arranged on the second pipe. The fourth valve prevents the third gas from flowing in a direction toward a supply source of the second gas.

The present invention ensures the stable supply of the process gas and the precursor gas to the processing chamber.

DETAILED DESCRIPTION

Figure 1:
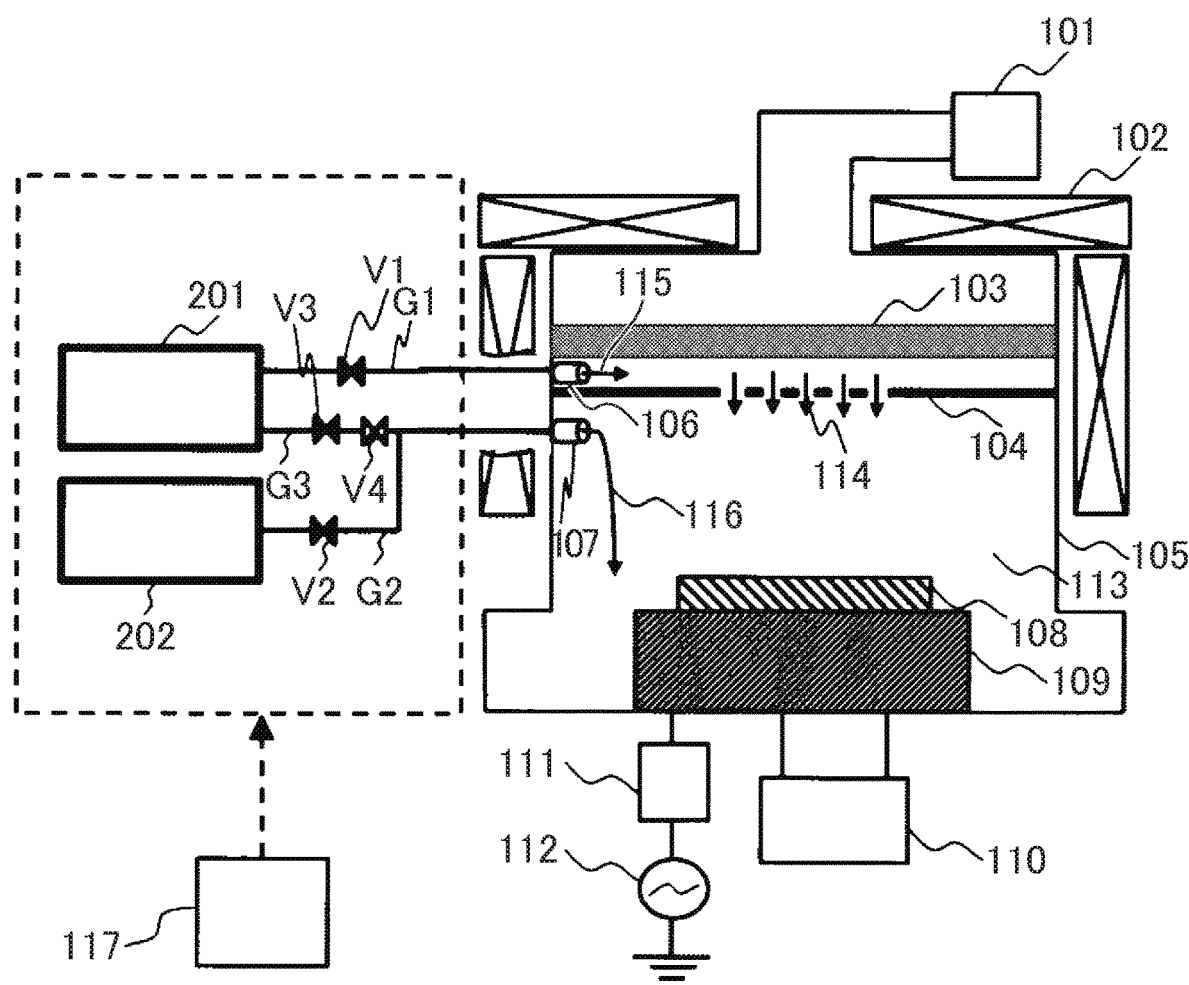
FIG. 1 is a schematic cross-sectional view of a plasma processing apparatus according to the present invention.

A plasma processing apparatus according to the embodiment excites particles such as atoms or molecules of a gas for processing to turn them into plasma. The gas for processing is supplied into a processing chamber arranged in a vacuum container using a microwave electric field as an electric field supplied into the processing chamber to generate the plasma inside the processing chamber. Then, the plasma processing apparatus etches a film structure containing a mask and a film layer as a process target that are preliminarily formed on a sample top surface having a substrate shape such as a semiconductor wafer arranged inside the processing chamber.

Especially, the plasma processing apparatus according to the embodiment is what is called a microwave ECR type plasma etching apparatus that forms a magnetic field inside the processing chamber together with the electric field, and causes the electric field to interact with the magnetic field with Electron Cyclotron Resonance (ECR) as a specific resonance between these electric field and magnetic field to generate the plasma.

A description will be given of a configuration of a plasma processing apparatus illustrated in FIG. 1. This plasma processing apparatus includes a vacuum container 105, a first gas supply unit 106, a second gas supply unit 107, and a stage 109. The vacuum container 105 can be decompressed and has a vacuum processing chamber 113 as an inside processing chamber where plasma processing is performed on a semiconductor wafer 108. The first gas supply unit 106 is coupled to the vacuum container 105 and supplies a first gas to generate the plasma inside the vacuum container 105. The second gas supply unit 107 supplies a second gas into the vacuum container 105. The stage 109 is a sample stage on which the semiconductor wafer 108 as a sample is placed.

Further, this plasma processing apparatus includes an electromagnetic-wave supply unit 101 and a radio frequency power supply 112. The electromagnetic-wave supply unit 101 supplies electromagnetic wave to generate the plasma. The radio frequency power supply 112 is coupled to the stage 109 and supplies radio frequency power via a matching box 111 to adjust ion energy that enters the wafer 108. The electromagnetic-wave supply unit 101 includes a radio frequency power supply 118 that supplies the radio frequency power to the vacuum processing chamber 113. The plasma processing apparatus includes a vacuum exhaust air unit 110 that exhausts air inside the vacuum processing chamber 113 of the vacuum container 105 to decompress the vacuum container 105.

Here, the first gas for plasma generation, which is supplied to the vacuum processing chamber 113, is supplied via a shower plate 104 from the first gas supply unit 106 via a gas supply line G1. An arrow 115 in FIG. 1 indicates a gas flow of the first gas. The use of the shower plate 104 improves in-plane uniformities of a distribution of the plasma and a flow rate distribution, thus uniformizing etching rates and deposition rates of the center and the outermost periphery in a processed sample.

Similarly, the second gas for plasma generation, which is supplied to the vacuum processing chamber 113, is supplied from the second gas supply unit 107 via a gas supply line G3. An arrow 116 in FIG. 1 indicates a gas flow of the second gas. Types and compositions of the first and second gases differ depending on a type and an objective processed shape of the processed material formed on the wafer 108.

A pressure inside the vacuum processing chamber 113 is adjusted by the vacuum exhaust air unit 110. For the vacuum exhaust air unit 110, for example, a configuration where a pressure control valve is coupled to a dry pump or a turbo molecular pump is used. The pressure inside the vacuum processing chamber 113 can be controlled at a desired pressure value appropriate for the plasma such that a degree of opening of the pressure control valve is controlled. In order to cause the ion to enter the wafer 108 with improving anisotropy, a pressure of about 0.1 to 100 Pa is generally used in an etching process.

The electromagnetic wave to generate the plasma is supplied from the electromagnetic-wave supply unit 101 to the vacuum processing chamber 113 via a dielectric window 103 formed of a material through which the electromagnetic wave is transmitted. For example, the electromagnetic wave is microwave having a frequency of 2.45 GHz, and the dielectric window 103 is formed of a material through which the microwave is transmitted, such as quartz. Additionally, an electromagnetic coil 102 forms the magnetic field required for the electron cyclotron resonance inside the vacuum processing chamber 113. For example, a magnetic-flux density required for the electron cyclotron resonance in the microwave of 2.45 GHz is 875 G. Here, a magnetic field forming mechanism is considered to include the magnetic field coil 102.

The microwave efficiently accelerates electron to obtain the electron having a high energy at the proximity of this magnetic field required for the electron cyclotron resonance. Then, this high-energy electron efficiently ionizes molecules of an etching gas, thus efficiently generating the plasma. Charged particles generated by the plasma are transported with being restrained by a magnetic line of the magnetic field formed by the electromagnetic coil 102. Accordingly, for example, controlling the magnetic field formed by the electromagnetic coil 102 ensures control of an ionic flux distribution onto the wafer 108.

The following describes a gas supply line and a valve configuration and control system in the gas supply unit of the plasma processing apparatus using FIG. 1.

A process-gas supply system 201 has the gas supply lines G1 and G3. The gas supplied from the gas supply line G1 is supplied to the vacuum container 105 via through-holes 114 of the shower plate 104. The gas supplied from the gas supply line G3 is supplied to the vacuum container 105 from a position without passing through the through-hole 114 of the shower plate 104. The gas supply line G1 has a valve V1. The gas supply line G3 has a valve V3 and a valve V4.

These valves V1 and V3 are normally closed type air-driven valves. The valve V4 is a normally open type air-driven valve. The valve V3 is arranged on a position far from the vacuum container 105 with respect to the valve V4. In this embodiment, the normally open type air-driven valve is used for the valve V4. However, if the normally closed type air-driven valve is used for the valve V4, there will be concern that the process gas mixes with the precursor gas. In view of this, in order to decrease the potential that the process gas mixes with the precursor gas, it is required to use the normally open type air-driven valve for the valve V4.

Next, a precursor-gas supply system 202 has a gas supply line G2. This gas supply line G2 has a valve V2. This valve V2 is a normally closed type air-driven valve. This gas supply line G2 is coupled to the gas supply line G3 to be coupled to a pipe between the valve V4 and the second gas supply unit 107. The "gas supply unit" of the plasma processing apparatus according to the present invention includes the process-gas supply system 201 and the precursor-gas supply system 202. The following describes a hard interlock between the above-described respective valves using FIG. 2.

Figure 2:
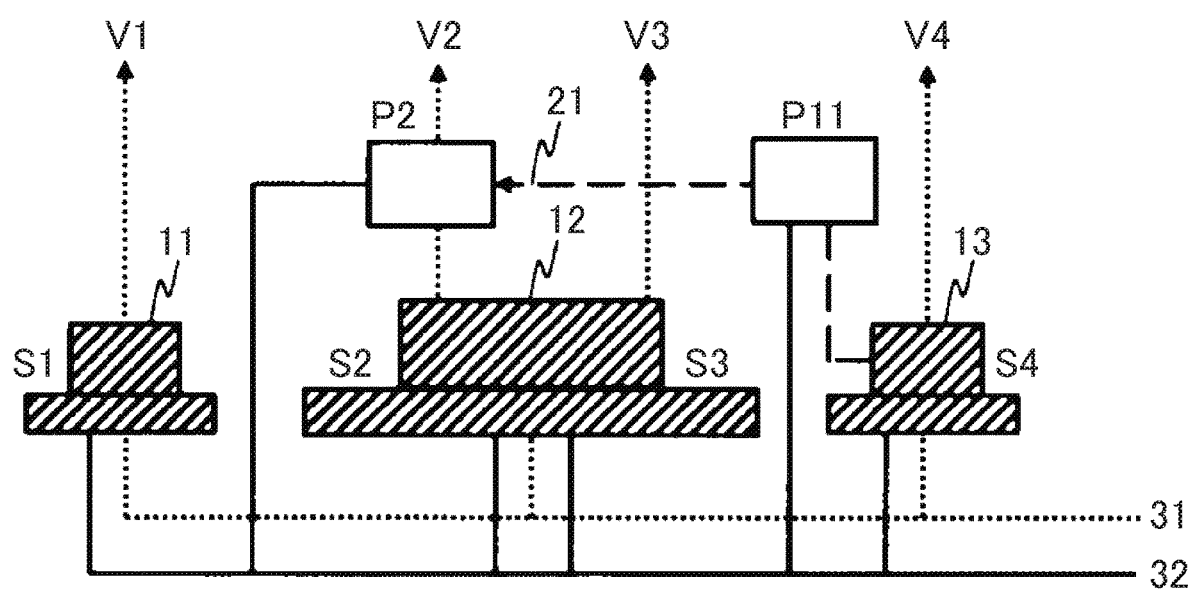
FIG. 2 is a schematic diagram of an air circuit of air for air-driven according to the present invention.

As illustrated in FIG. 2, the air for air-driven of the valve V2 is controlled by a 3-position spring return center exhaust type 5-port solenoid valve 12 via a pilot valve P2. This solenoid valve has solenoid coil excitation elements S2 and S3, and any one of the solenoid coil excitation element S2 and the solenoid coil excitation element S3 is excited. For example, V2 is opened via the pilot valve P2 when the solenoid coil excitation element S2 is excited, and V3 is opened when the solenoid coil excitation element S3 is excited. In view of this, an air signal is formed in inevitably only the solenoid coil excitation element at an excited side, thus preventing both of the valve V2 and the valve V3 from simultaneously opening.

The pilot valve P2, which is a pilot valve for forming the air signal, is controlled with a signal transmitted by a pilot air signal line 21 formed by a pilot valve P11. The air for air-driven of V3 is controlled by the 3-position spring return center exhaust type 5-port solenoid valve 12.

The air for air-driven of the valve V1 and the valve V4 is controlled by 2-position spring return type solenoid valves 11 and 13 respectively. For these solenoid valves, the respective valves are opened such that respective solenoid coil excitation elements are excited. In accordance with signals that excite solenoid coil excitation elements S1 and S4, the airs for opening the respective valve V1 and valve V4 are generated. Further, the pilot valve P11 is controlled by the 2-position spring return type solenoid valve 13 that controls the air for air-driven of the valve V4.

This pilot valve P11, which is a pilot valve for forming the air signal, forms the pilot air signal line 21. The air is taken in from an air source 32 with a signal transmitted through the pilot air signal line 21, this taken air is supplied to the pilot valve P2, and then, the air is supplied to the valve V2 from the pilot valve P2. The air supplied from the air source 32 is exhausted from an air exhaust line 31 after driving the respective valves. The following describes operation of the respective valves when the precursor gas or the process gas is supplied.

In the case where the precursor gas is supplied in an air circuit illustrated in FIG. 2, when the solenoid coil excitation element S4 is excited, the pilot air signal line 21 is formed through the pilot valve P11 at the same time as the valve V4 is closed. In view of this, the pilot valve P2 is driven to make an inside of the pilot valve passable. When the solenoid coil excitation element S2 is excited, the valve V2 is opened to supply the precursor gas. In this respect, an inert gas is supplied such that the solenoid coil excitation element S1 is excited to open the valve V1 in order to prevent the precursor gas to the shower plate.

Next, in the case where the process gas is supplied in the air circuit illustrated in FIG. 2, when the solenoid coil excitation elements S1 and S3 are excited, the valves V1 and V3 are opened to supply the process gas to the vacuum container 105. Since the solenoid coil excitation element S2 is not excited, the valve V4 is opened. In this case, even if the 3-position spring return center exhaust type 5-port solenoid valve 12 malfunctions or breaks down to excite the solenoid coil excitation element S2, the valve V2 is not opened since the pilot valve P2 is not driven. Thus, the precursor gas does not mix with the process gas. The following describes a necessity of the valve V4.

Figure 8:
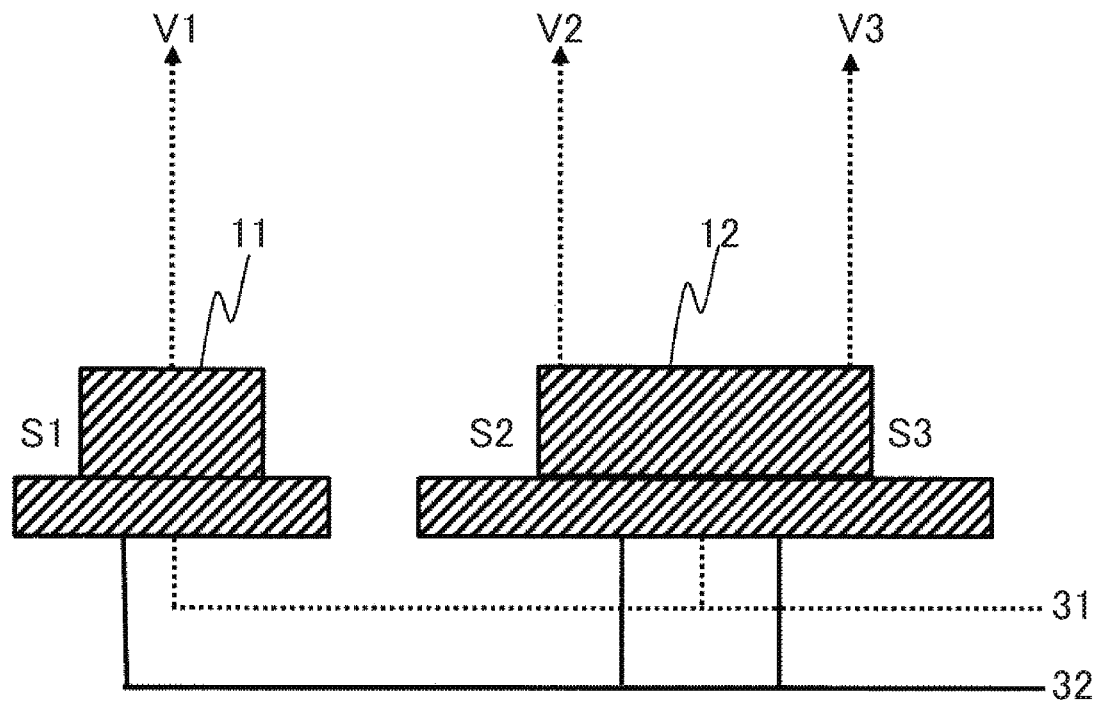
FIG. 8 is a schematic diagram of an air circuit of air for air-driven.

A hard interlock in a case where there is no normally open type air-driven valve V4 in FIG. 1 will be described using FIG. 8. As illustrated in FIG. 8, the airs for air-driven of the valves V2 and V3 are controlled by the 3-position spring return center exhaust type 5-port solenoid valve 12. The air for air-driven of the valve V1 is controlled by the 2-position spring return type solenoid valve 11. In the case of an air circuit as illustrated in FIG. 8, the air signal is formed at inevitably only the excited side of the solenoid coil excitation elements S2 and S3 for the valves V2 and V3.

In such air circuit, when the valve V1 is opened to supply the process gas other than the inert gas, there is concern that the solenoid coil excitation element S2 excited due to the malfunction or the breakdown opens the valve V2 to supply the precursor gas, and this causes the process gas to mix with and react to the precursor gas inside the plasma processing apparatus to generate a particle, thus breaking the plasma processing apparatus.

In view of this, the normally open type air-driven valve V4 is arranged on the gas supply line G3, and the hard interlock illustrated in FIG. 2 is applied, thus ensuring formation of a double hard interlock to improve a safe performance. The following describes a necessity that the valve V4 is the normally open type air-driven valve.

Figure 9:
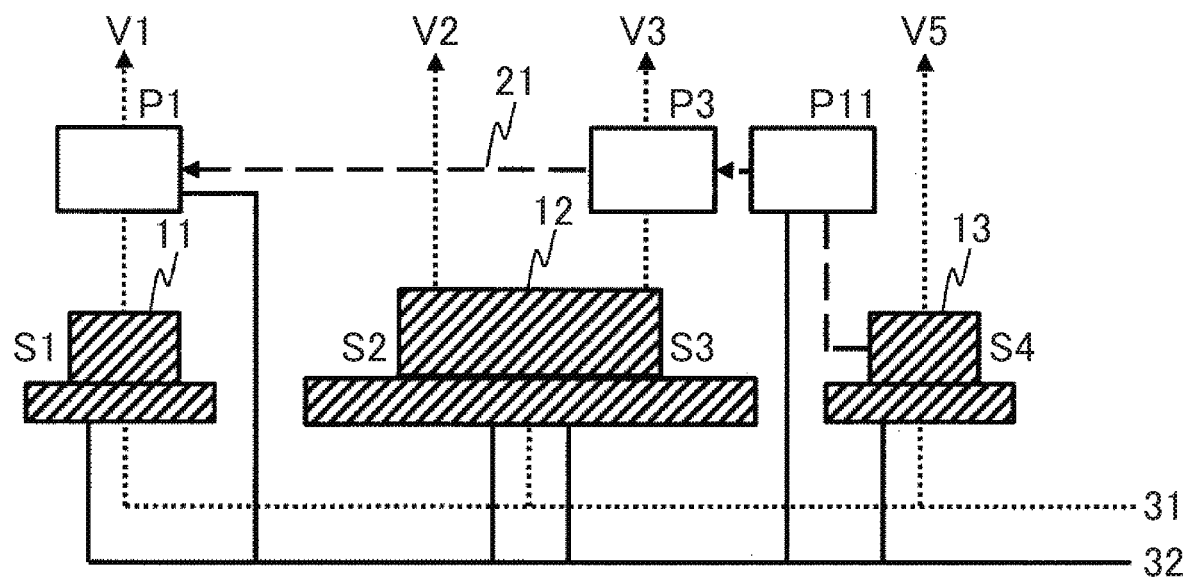
FIG. 9 is a schematic diagram of an air circuit of air for air-driven.

A structure of a hard interlock when the normally closed type air-driven valve is used for the valve V4 will be described using FIG. 9. FIG. 9 illustrates a valve V5 used as a substitute for the valve V4. As illustrated in FIG. 9, the air for air-driven of the valve V1 is controlled by the 2-position spring return type solenoid valve 11 via a pilot valve P1. The pilot valve P1 is controlled with the signal transmitted from the pilot air signal line 21 from a pilot valve P3. The valve V2 is controlled by the 3-position spring return center exhaust type 5-port solenoid valve 12.

The air for air-driven of the valve V3 is controlled by the 3-position spring return center exhaust type 5-port solenoid valve 12 via the pilot valve P3. The air is supplied to the pilot valve P3 from the air source 32 via the pilot valve 11. The air for air-driven of the valve V5, which is the normally closed type air-driven valve, is controlled by the 2-position spring return type solenoid valve 13. The pilot valve P11 is controlled by the 2-position spring return type solenoid valve 13.

In such air circuit illustrated in FIG. 9, when the valve V1 is opened to supply the process gas other than the inert gas similarly to the case in FIG. 8, although the valve V2 must not be opened to supply the precursor gas, there is concern that the solenoid coil excitation element S2 excited due to the malfunction or the breakdown opens the valve V2 to supply the precursor gas, and this causes the process gas to react to the precursor to break the plasma processing apparatus.

Figure 3A:
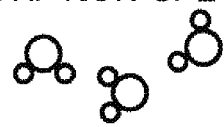
FIG. 3A-3D are diagrams illustrating a flow of an ALD process.
Figure 3A:
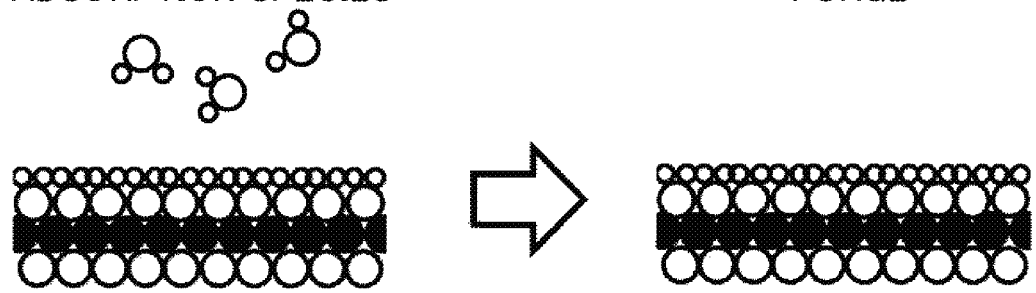
Figure 3B:
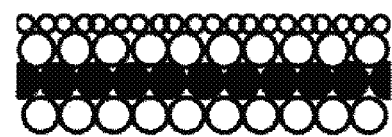
Figure 3D:
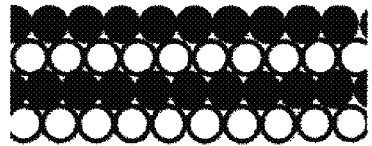
Figure 3C:
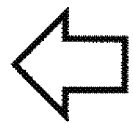
Figure 3C:
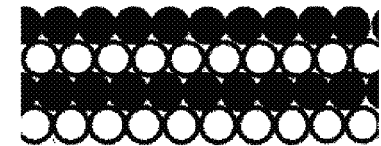

The following describes an outline of an ALD process using FIGS. 3A to 3D. FIG. 3A is an adsorption species step of supplying a precursor (an adsorption species). FIG. 3B is a purge step of exhausting the precursor. FIG. 3C is a reaction step of supplying a reactive species to cause the adsorption species to react to the reactive species using the plasma. FIG. 3D is a purge step of exhausting the reactive species. The ALD process sequentially repeats the respective steps in FIGS. 3A to 3D until a desired film thickness is obtained. The following describes operation of the gas supply unit when such ALD process is performed using FIGS. 4A to 4D.

Figure 4A:
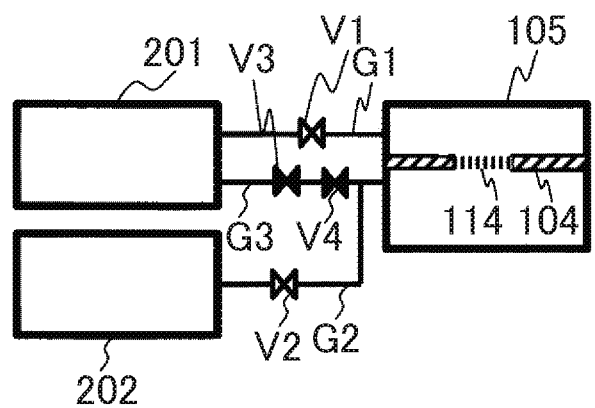
FIG. 4A-4D are diagrams illustrating operation of a gas supply unit according to the present invention at the time of the ALD process.

As illustrated in FIG. 4A, in the adsorption species step (FIG. 3A), in order to supply the precursor gas as a gas for deposition process from the precursor-gas supply system 202, the valve V2 is opened with air control, and simultaneously, the valve V4 is closed with the air control. The valve V3 is closed since the valve V2 is opened. In order to prevent the precursor gas from flowing backward to the shower plate 104, the valve V1 is opened with the air control to supply an Ar gas from the gas supply system 201. Here, the inert gas such as a He gas, a Kr gas, and a Xe gas may be used instead of the Ar gas. The precursor gas is, for example, a BTBAS {chemical name: Bis-Tertiary Butyl Amino Silane, chemical formula: SiH2[NHC(CH3)3]2} gas, a BDEAS {chemical name: Bis(DiEthylAmido)Silane, chemical formula: H2Si[N(C2H5)2]2} gas, and a $SiCl_4$ gas.

Figure 4B:
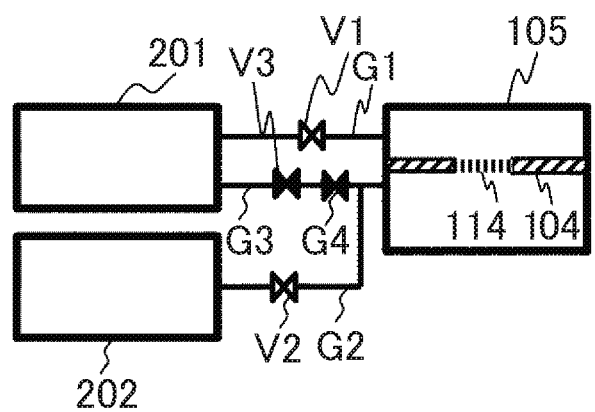

Next, as illustrated in FIG. 4B, in the purge step (FIG. 3B), in order to exhaust the precursor gas from the vacuum container 105, the valve V1 is opened, the valve V2 is opened, and the valve V4 is closed to supply the Ar gas from the process-gas supply system 201 and the precursor-gas supply system 202. The valve V3 is closed since the valve V2 is opened. Here, the inert gas such as the He gas, the Kr gas, and the Xe gas may be used instead of the Ar gas.

Figure 4C:
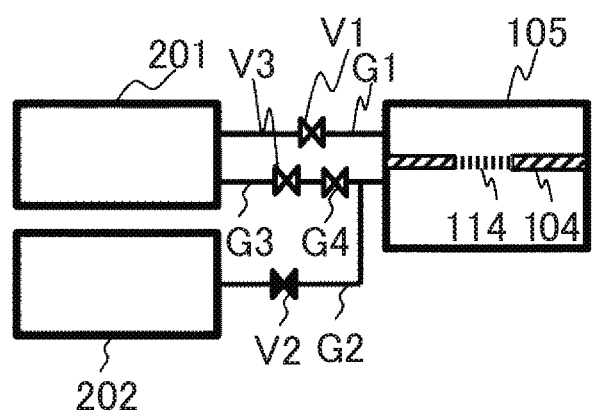

Subsequently, as illustrated in FIG. 4C, in the reaction step (FIG. 3C), the valve V2 is closed with the air control, and simultaneously, the valve V4 is opened with the air control. The valve V3 is opened since the valve V2 is closed. The valve V1 is opened to supply the reactive species from the process-gas supply system 201 to generate the plasma, thus causing the reactive species to react to the adsorption species. Here, when the reactive species is caused to react to the adsorption species to generate $SiO_2$ (a silicon oxide film), an $O_2$ gas is used as the reactive species. When the reactive species is caused to react to the adsorption species to generate $Si_3N_4$ (a silicon nitride film), an $N_2$ gas is used as the reactive species.

Figure 4D:
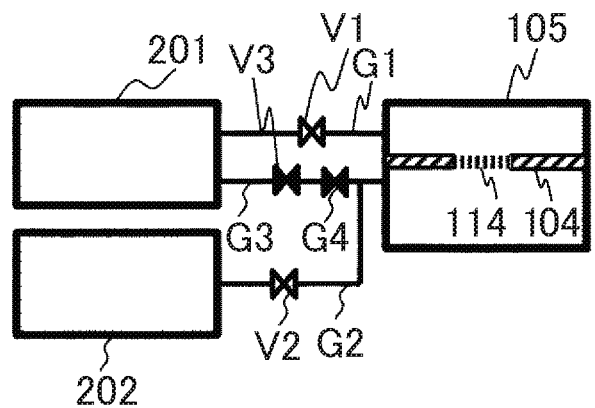

Next, as illustrated in FIG. 4D, in the purge step (FIG. 3D), in order to exhaust the reactive species from the vacuum container 105, the valves V1 and V2 are opened with the air control to supply the inert gas from the process-gas supply system 201 and the precursor-gas supply system 202. At this time, the valve V3 is closed since the valve V2 is opened, and the valve V4 is closed with the air control.

As described above, the ALD process according to the present invention sequentially repeats the respective steps in FIGS. 4A to 4D until the desired film thickness is obtained. The following describes operation when the ALD process is performed with a structure illustrated in FIG. 7 as a comparative example.

In the adsorption species step (FIG. 3A), in order to supply the precursor gas from the precursor-gas supply system 202, the valve V2 is opened with the air control. In order to prevent the precursor gas from flowing backward to a shower plate 203, the valve V1 is opened with the air control to supply the inert gas from the gas supply system 201.

Next, in the purge step (FIG. 3B), in order to exhaust the precursor gas from a vacuum container 204, the valves V1 and V2 are opened with the air control to supply the inert gas from the process-gas supply system 201 and the precursor-gas supply system 202. Then, in the reaction step (FIG. 3C), the valve V2 is closed with the air control, and the valve V1 is opened to supply the reactive species from the process-gas supply system 201. Next, in the purge step (FIG. 3D), in order to exhaust the reactive species from the vacuum container 204, the valves V1 and V2 are opened with the air control to supply the inert gas from the process-gas supply system 201 and the precursor-gas supply system 202.

Figure 7:
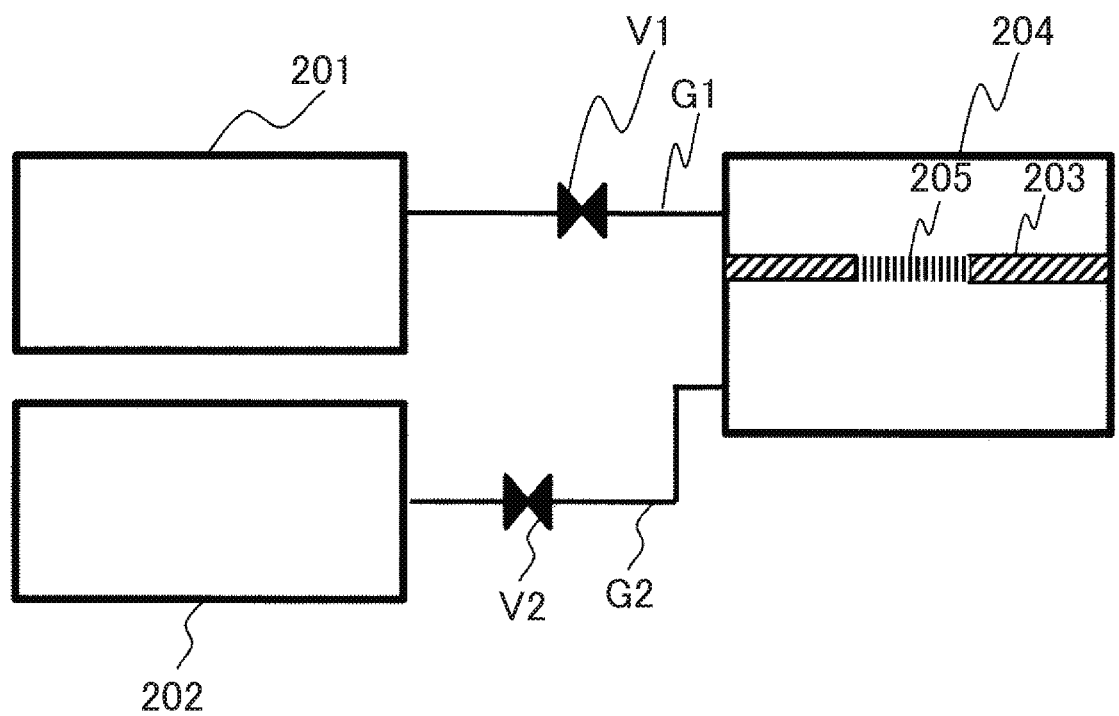
FIG. 7 is a schematic diagram illustrating a gas supply mechanism.

In the case of such ALD process with the structure illustrated in FIG. 7, in the reaction step (FIG. 3C), if there is no function that supplies the process gas to the precursor-gas supply system 202 when the reactive species is supplied from the process-gas supply system 201, the reactive species cannot be supplied simultaneously with the process gas. The reason that the reactive species cannot be supplied is that there is concern that etchant that has turned into plasma flows backward to the gas supply line G2 to break the precursor-gas supply system.

In this case, for preventing the inert gas from flowing backward, it is thought that the inert gas is supplied simultaneously with the reactive species. However, there is concern that, when the inert gas is supplied simultaneously with the reactive species, spatter of the inert gas cuts the generated film. Thus, the inert gas cannot be used for preventing the backflow. Further, although the structure in FIG. 7 can include a function that supplies the reactive species to the precursor-gas supply system, it is necessary to add a mass flow controller (MFC) and a gas supply line. In view of this, it is necessary to include the mass flow controller and the like for each of all the used reactive species, thus causing a large disadvantage from the aspect of cost.

Meanwhile, the gas supply unit according to the present invention illustrated in FIG. 1 can supply the reactive species from the gas supply line G3 through which the gas is supplied to the vacuum container 105 without the through-hole 114 of the shower plate 104. This can prevent the etchant that has turned into plasma from flowing backward to break the precursor-gas supply system 202.

As described above, the gas supply unit of the present invention can include the double hard interlock with respect to the precursor gas, thus having a sufficient performance as a foolproof function. This ensures reliability and a safety of a vacuum processing apparatus. In other words, the process gas does not mix with the precursor gas since the hard interlock for a precursor gas supply valve is double even if any one function in the hard interlock malfunctions or breaks down. In view of this, it can be said to have a double hard interlock function having a sufficient performance as the foolproof function.

The following describes an embodiment different from the operation of the gas supply unit at the time of the ALD process illustrated in FIGS. 4A to 4D, regarding the operation of the gas supply unit when the ALD process is performed, using FIGS. 5A to 5D. In the following embodiment, the operation of the respective valves of the gas supply unit illustrated in FIGS. 5A to 5D is different from the operation of the respective valves of the gas supply unit illustrated in FIGS. 4A to 4D in that the valves V1 and V3 become an identical open/close state in conjunction. For example, in the gas supply unit illustrated in FIGS. 5A to 5D, V3 is opened when V1 is opened, and V3 is closed when V1 is closed.

Figure 5A:
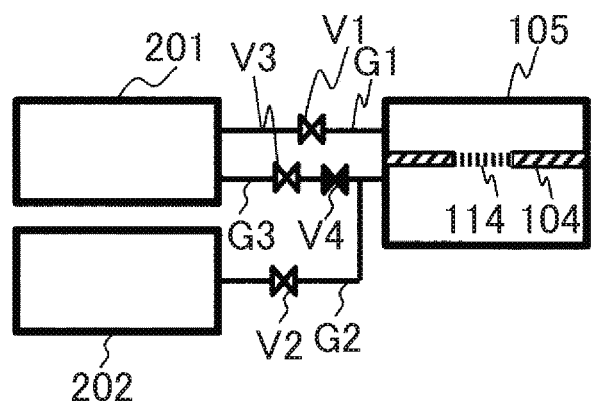
FIG. 5A-5D are diagrams illustrating operation of a gas supply unit according to the present invention at the time of the ALD process.

As illustrated in FIG. 5A, in the adsorption species step (FIG. 3A), in order to supply the precursor gas as the gas for deposition process from the precursor-gas supply system 202, the valve V2 is opened with the air control, and simultaneously, the valve V4 is closed with the air control. In order to prevent the precursor gas from flowing backward to the shower plate 104, the valve V1 is opened with the air control to supply the Ar gas from the gas supply system 201. Although the valve V3 is opened since the valve V1 is opened, the gas is not supplied from the process-gas supply system 201. Here, the inert gas such as the He gas, the Kr gas, and the Xe gas may be used instead of the Ar gas. The precursor gas is, for example, the BTBAS {chemical name: Bis-Tertiary Butyl Amino Silane, chemical formula: $SiH_2[NHC(CH_3)_3]_2$} gas, the BDEAS {chemical name: Bis (DiEthylAmido)Silane, chemical formula: $H_2Si[N(C_2H_5)_2]_2$} gas, and the $SiCl_4$ gas.

Figure 5B:
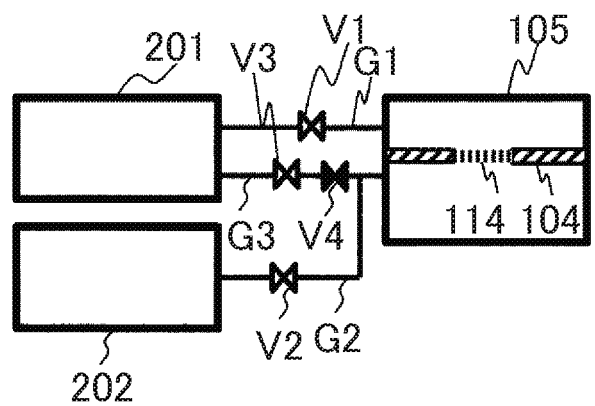

Next, as illustrated in FIG. 5B, in the purge step (FIG. 3B), in order to exhaust the precursor gas from the vacuum container 105, the valve V1 is opened, the valve V2 is opened, and the valve V4 is closed to supply the Ar gas from the process-gas supply system 201 and the precursor-gas supply system 202. Although the valve V3 is opened since the valve V1 is opened, the gas is not supplied from the process-gas supply system 201. Here, the inert gas such as the He gas, the Kr gas, and the Xe gas may be used instead of the Ar gas.

Figure 5C:
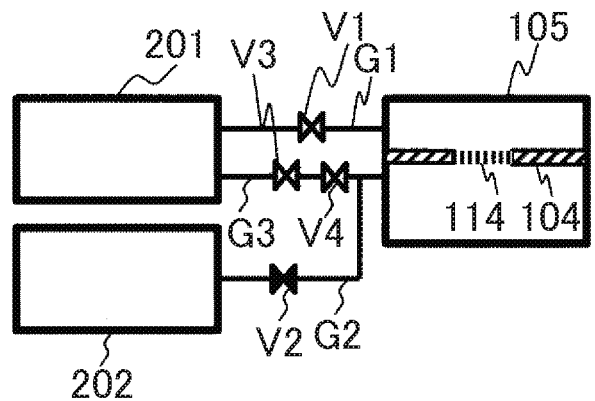

Subsequently, as illustrated in FIG. 5C, in the reaction step (FIG. 3C), the valve V2 is closed with the air control, and simultaneously, the valve V4 is opened with the air control. The valve V1 is opened to supply the reactive species from the process-gas supply system 201 to generate the plasma, thus causing the reactive species to react to the adsorption species. The valve V3 is opened since the valve V1 is opened, thus supplying the reactive species from the process-gas supply system 201. Here, when the reactive species is caused to react to the adsorption species to generate $SiO_2$ (the silicon oxide film), the $O_2$ gas is used as the reactive species. When the reactive species is caused to react to the adsorption species to generate $Si_3N_4$ (the silicon nitride film), the $N_2$ gas is used as the reactive species.

Figure 5D:
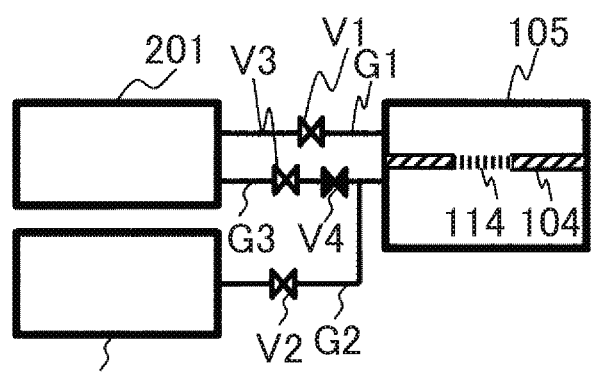
Figure 6:
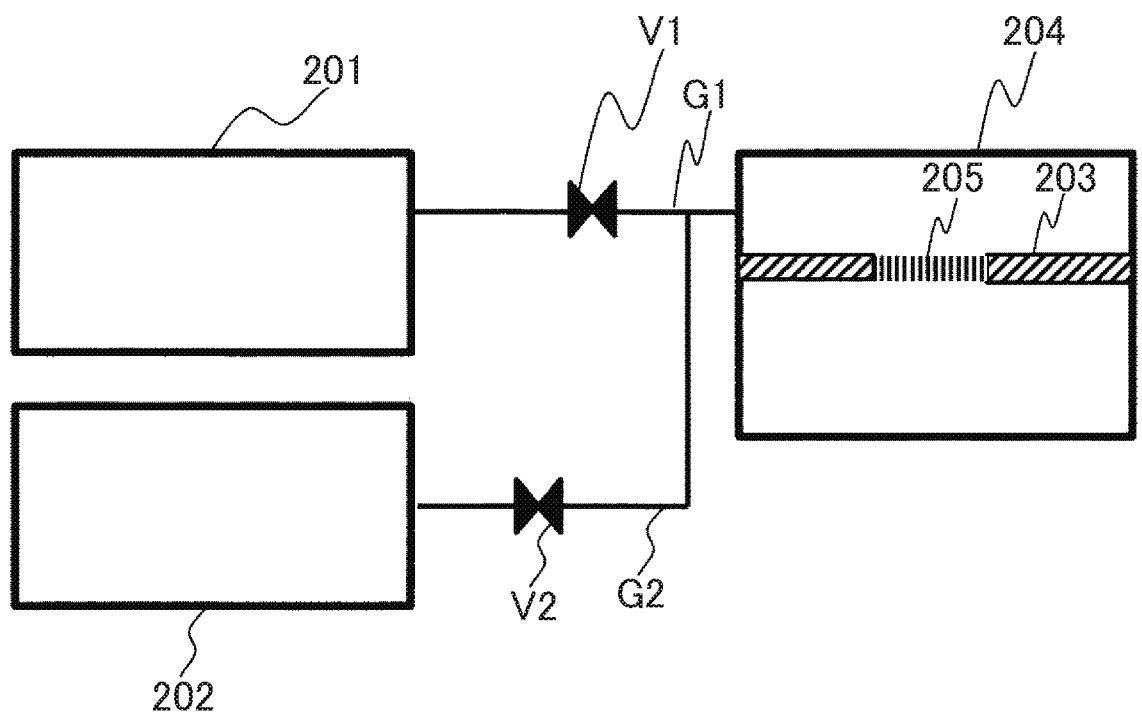
FIG. 6 is a schematic diagram illustrating a gas supply mechanism.

Next, as illustrated in FIG. 5D, in the purge step (FIG. 3D), in order to exhaust the reactive species from the vacuum container 105, the valves V1 and V2 are opened with the air control to supply the inert gas from the process-gas supply system 201 and the precursor-gas supply system 202. At this time, although the valve V3 is opened since the valve V1 is opened, the gas is not supplied from the process-gas supply system 201. The valve V4 is closed with the air control.

As described above, the ALD process according to the present invention sequentially repeats the respective steps in FIGS. 5A to 5D until the desired film thickness is obtained. The respective valves V1 to V4 illustrated in FIGS. 5A to 5D do not need to use the 3-position spring return center exhaust type 5-port solenoid valve. For example, the operation of the respective valves V1 to V4 illustrated in FIGS. 5A to 5D can be performed such that the 2-position spring return type solenoid valve controls the airs for air-driven of all the valves V1 to V4.

As described above, the gas supply unit illustrated in FIGS. 5A to 5D can include the hard interlock with respect to the precursor gas to ensure the reliability and the safety of the vacuum processing apparatus.

The operation of the respective valves V1 to V4 according to FIGS. 4A to 4D and FIGS. 5A to 5D is controlled by a control device 117. Further, the control device 117 also performs control according to the plasma processing by the plasma processing apparatus according to the present invention such as the electromagnetic-wave supply unit 101, the radio frequency power supply 118, the electromagnetic coil 102, and the vacuum exhaust air unit 110.

In the above-described embodiment, the plasma processing apparatus having the microwave ECR plasma source has been described as one embodiment. However, also in a plasma processing apparatus in another plasma generation system such as a capacitive coupling type plasma source and an inductive coupling type plasma source, the effect similar to that of this embodiment can be obtained.

The present invention can inhibit reduction in yield of the sample substrate in accordance with particle generation on the shower plate with the precursor gas.

What is claimed is:

1. A plasma processing apparatus comprising:
   a processing chamber where plasma processing is performed on a sample;
   a radio frequency power supply that supplies radio frequency power to generate plasma;
   a sample stage on which the sample is placed;
   a gas supply unit that supplies a gas to the processing chamber; and
   a gas supply plate arranged on an upper portion of the processing chamber, a plurality of gas holes that supply a gas into the processing chamber being provided in the gas supply plate,
   wherein the gas supply unit includes
      a first pipe that supplies a first gas as a gas for etching process to the processing chamber, the first pipe having a first air-driven valve arranged thereon and which is a normally closed type air-driven valve;
      a second pipe that supplies a second gas as a gas for etching process to the processing chamber, the second pipe having a second air-driven valve arranged thereon and which is a normally closed type air-driven valve;
      a third pipe through which a third gas as a gas for deposition process flows, the third pipe being coupled to the second pipe, and the third pipe having a third air-driven valve arranged thereon which is a normally closed type air-driven valve; and
      a fourth air-driven valve arranged on the second pipe, the fourth air-driven valve being a normally open type air-driven valve configured to prevent the third gas from flowing in a direction toward a supply source of the second gas,
   wherein the second pipe is coupled to an inlet side of the processing chamber such that the second gas is supplied to the processing chamber from a height between the gas supply plate and the sample stage, and
   wherein the third pipe is coupled to the second pipe at a point disposed between the fourth air-driven valve and a coupling location of the second pipe to the inlet side of the processing chamber.

2. The plasma processing apparatus according to claim 1, wherein the fourth air-driven valve is arranged on a position close to the processing chamber with respect to the second air-driven valve.

3. The plasma processing apparatus according to claim 1, wherein the control device is further configured to control the first air-driven valve and the second air-driven valve such that the second air-driven valve is opened when the first air-driven valve is opened, and the second air-driven valve is closed when the first air-driven valve is closed.

4. The plasma processing apparatus according to claim 3,
wherein the control device is configured to supply the first gas to the processing chamber and to close the fourth air-driven valve when the third gas is supplied to the processing chamber, and
wherein the first gas is an inert gas.

5. The plasma processing apparatus according to claim 1, further comprising a 3-position spring return center exhaust type 5-port solenoid valve that controls air that drives the second air-driven valve and the third air-driven valve.

6. The plasma processing apparatus according to claim 1, further comprising an air circuit that controls air that drives the first air-driven valve and the fourth air-driven valve,
wherein the air circuit includes a logic circuit unit that configures a logic circuit that establishes open/close conditions for the first air-driven valve and the fourth air-driven valve.

7. The plasma processing apparatus according to claim 6, wherein the first air-driven valve and the fourth air-driven valve are opened and closed via a pilot valve in response to air supplied from the logic circuit.

8. The plasma processing apparatus according to claim 4,
wherein the first pipe is coupled to the processing chamber such that the first gas is supplied to the processing chamber via the gas supply plate.

9. The plasma processing apparatus according to claim 8, further comprising a magnetic field forming mechanism that forms a magnetic field inside the processing chamber,
wherein the radio frequency power is radio frequency power of a microwave.

* * * * *